(12) United States Patent
Zettler et al.

(10) Patent No.: US 10,705,132 B2
(45) Date of Patent: Jul. 7, 2020

(54) SEMICONDUCTOR CHIP WITH FRACTURE DETECTION

(71) Applicant: Infineon Technologies AG, Neubiberg (DE)

(72) Inventors: Thomas Zettler, Hoehenkirchen-Siegertsbrunn (DE); Dirk Hammerschmidt, Finkerstein (AT); Friedrich Rasbornig, Klagenfurt (AT); Wolfgang Scheibenzuber, Munich (DE); Hans-Joerg Wagner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/290,196

(22) Filed: Mar. 1, 2019

(65) Prior Publication Data
US 2019/0195937 A1 Jun. 27, 2019

Related U.S. Application Data

(62) Division of application No. 15/425,382, filed on Feb. 6, 2017, now Pat. No. 10,281,517.

(30) Foreign Application Priority Data

Feb. 10, 2016 (DE) .................. 10 2016 102 291

(51) Int. Cl.
*G01R 31/02* (2006.01)
*G01R 31/26* (2020.01)
(Continued)

(52) U.S. Cl.
CPC ......... *G01R 31/26* (2013.01); *G01R 31/2884* (2013.01); *H01L 22/32* (2013.01);
(Continued)

(58) Field of Classification Search
CPC ................................... G01R 31/26; G01R 31/2884; G01R 31/2621; H01L 22/32; H01L 22/12;
(Continued)

(56) References Cited

U.S. PATENT DOCUMENTS 4,967,146 A 10/1990 Morgan et al.
7,791,070 B2 9/2010 Huang et al.
(Continued)

FOREIGN PATENT DOCUMENTS

CN 102867812 A 1/2013
JP 2005292505 A 10/2005

OTHER PUBLICATIONS

German Patent Office, Office Action issued for DE 102016102291.8, dated Nov. 25, 2016.
(Continued)

*Primary Examiner* — Thang X Le
(74) *Attorney, Agent, or Firm* — Schiff Hardin LLP

(57) ABSTRACT

A method including feeding a test signal into a first end of a conductor track of a semiconductor chip, wherein the conductor track crosses an indentation of a substrate of the semiconductor chip; and detecting the test signal at a second ends of the conductor track, which wherein the detected test signal is indicative of fracture of the substrate of the semiconductor chip at the indentation.

20 Claims, 6 Drawing Sheets

(51) Int. Cl.
*G01R 31/28* (2006.01)
*H01L 21/66* (2006.01)

(52) U.S. Cl.
CPC .... *H01L 22/34* (2013.01); *H01L 2224/48091* (2013.01); *H01L 2224/48247* (2013.01); *H01L 2924/181* (2013.01)

(58) Field of Classification Search
CPC ......... H01L 22/14; H01L 22/20; H01L 22/34; H01L 2924/181; H01L 2924/48091; H01L 2924/48247; H01L 2924/3512; H01L 2924/0002; H01L 27/124; H01L 23/48; H01L 23/495; H01L 23/544
See application file for complete search history.

(56) References Cited

U.S. PATENT DOCUMENTS

| | | | |
|---|---|---|---|
| 9,070,683 B2* | 6/2015 | Fender | H01L 22/34 |
| 9,378,317 B2* | 6/2016 | Tschmelitsch | H01L 22/34 |
| 9,557,376 B2* | 1/2017 | Dennison | H01L 22/14 |
| 2007/0257353 A1 | 11/2007 | Park | |
| 2007/0262370 A1 | 11/2007 | Okada | |
| 2008/0012572 A1* | 1/2008 | Tsukuda | G01R 31/2884 324/522 |
| 2012/0049884 A1 | 3/2012 | Kaltaliog Lu | |
| 2013/0009663 A1 | 1/2013 | Gauch et al. | |
| 2013/0075859 A1* | 3/2013 | Kerber | H01L 28/10 257/531 |
| 2014/0375341 A1 | 12/2014 | Fender et al. | |
| 2016/0197056 A1 | 7/2016 | Bhowmik et al. | |

OTHER PUBLICATIONS

Office Action dated Dec. 19, 2018 for Chinese Application No. 201710073796.7.

* cited by examiner

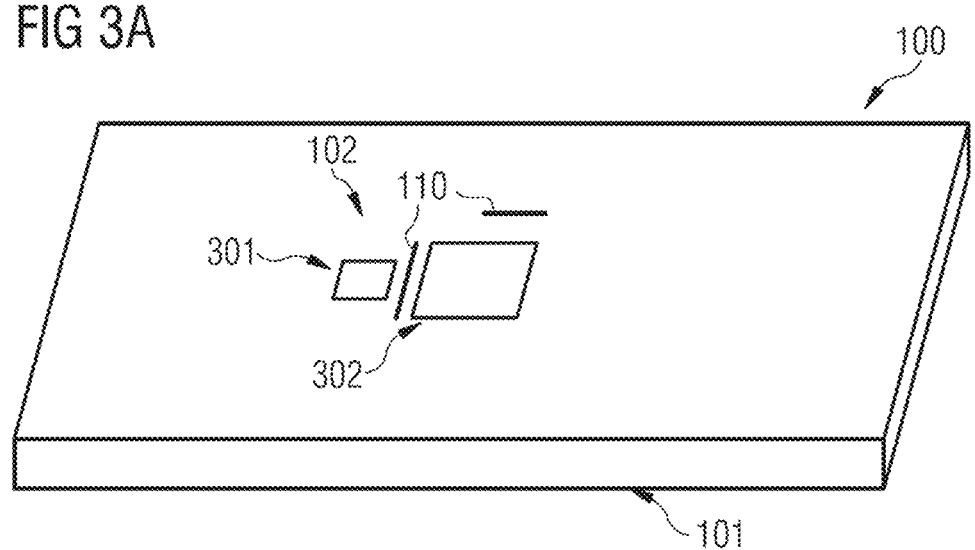
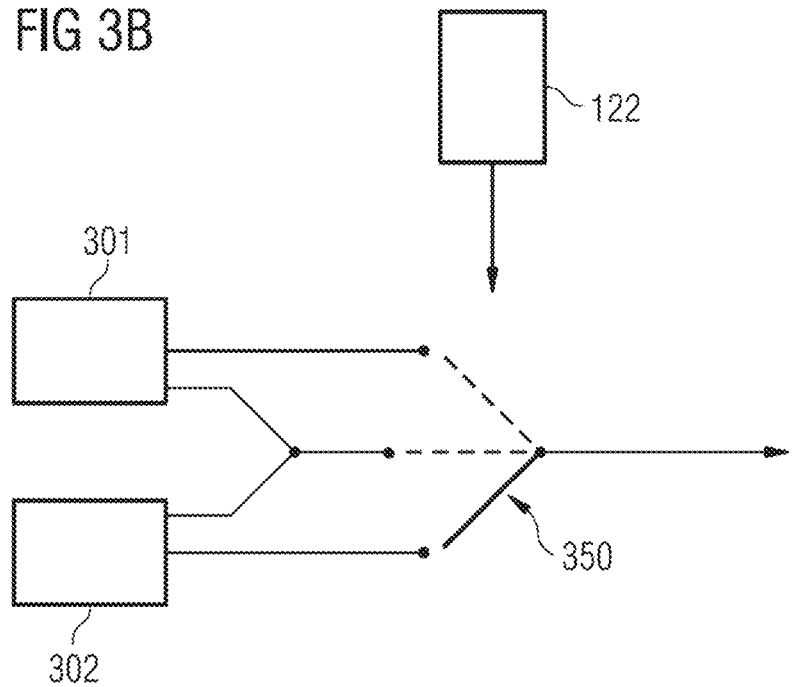

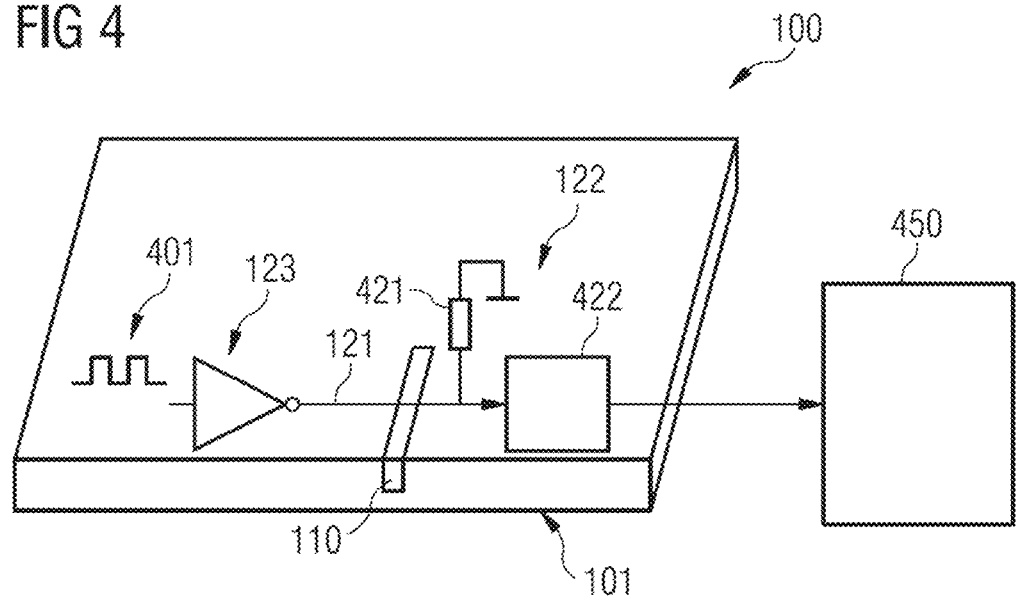
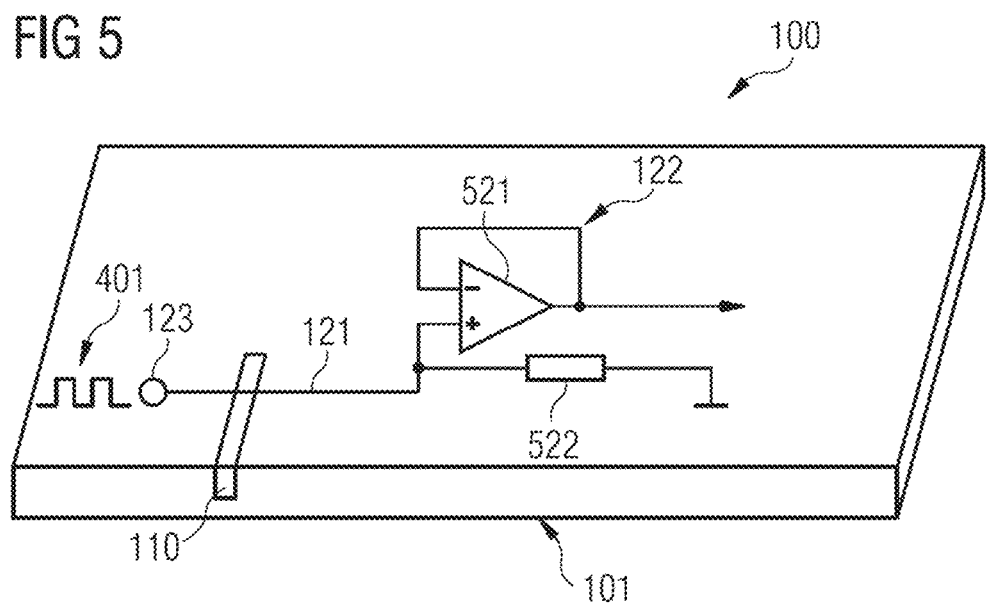

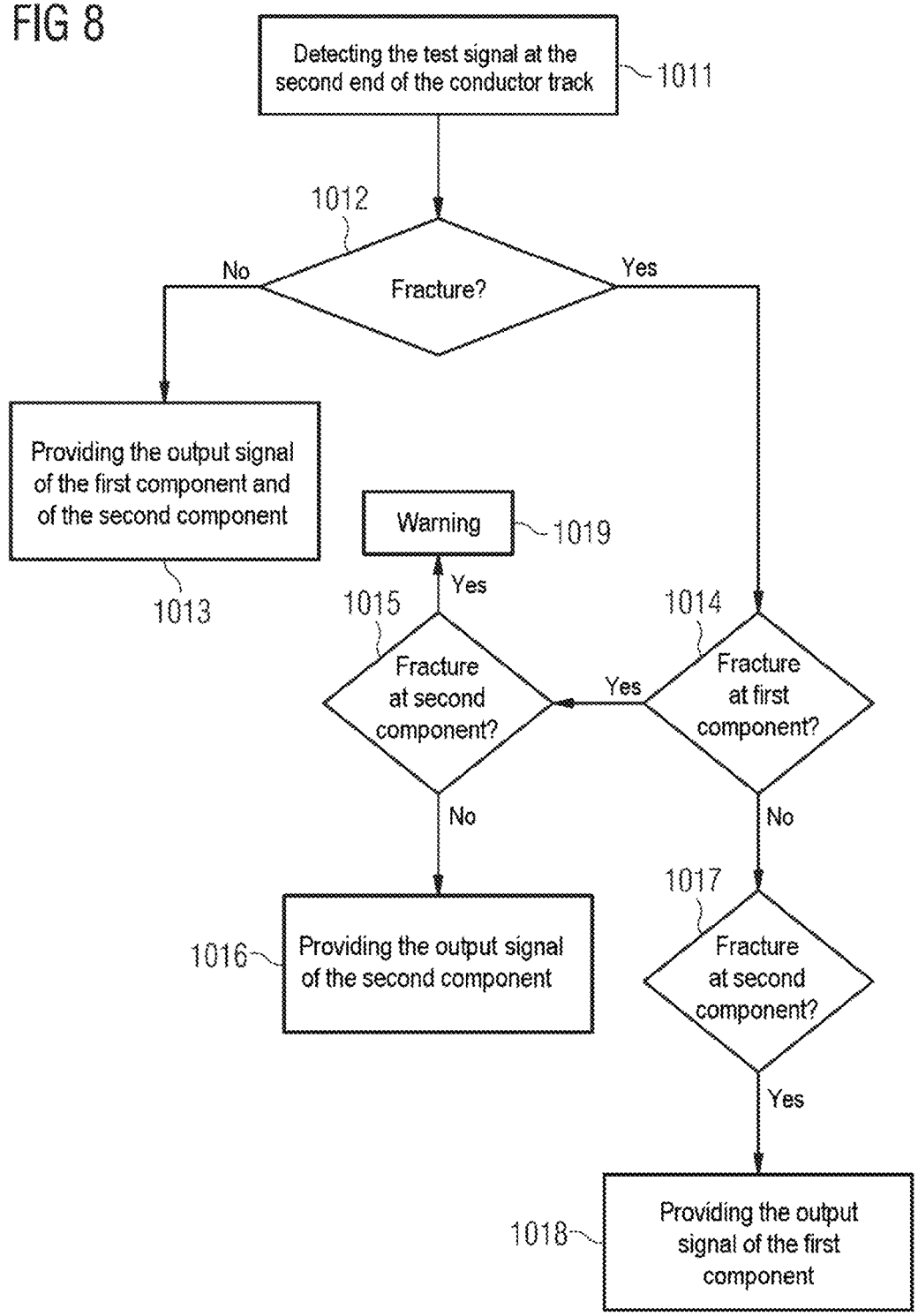

SEMICONDUCTOR CHIP WITH FRACTURE DETECTION

TECHNICAL FIELD

Various embodiments relate to a semiconductor chip comprising a substrate, an integrated circuit, an indentation of the substrate, a conductor track and a crossover between the indentation of the substrate and the conductor track. Further embodiments relate to methods comprising detecting a test signal, which is indicative of fracture of the substrate of the semiconductor chip at the indentation.

BACKGROUND

Modern electronic systems use semiconductor chips that comprise integrated circuits having specific functionality on a substrate. The fail-safety of the corresponding electronic systems must satisfy stringent requirements in various applications. By way of example, for automotive applications it may be necessary to fulfill comparatively strict requirements made of the fail-safety for example in accordance with International Organization for Standardization (ISO) Standard 26262. The fail-safety of a corresponding electronic system is typically characterized by the reaction to an unintended fault that leads to a safeguard state.

One known class of unintended faults in electronic systems based on semiconductor chips is caused by fracture of the substrate. A fracture of the substrate corresponds to a local destruction of the structure of the substrate. This can lead to cracks in the substrate or the complete separation of the substrate. By way of example, the fracture of the substrate can occur on account of mechanical loading. One example of a situation in which mechanical loading occurs which can lead to a fracture is the process of arranging the housed semiconductor component in a module housing by means of injection-molding technology (referred to as overmolding).

Depending on the severity of the fracture of the substrate, a restricted functionality of the electronic system through to total failure can result therefrom. The fracture can bring about a partial or total interruption of electrical connections of the integrated circuit of the semiconductor chip. Such a partial or total interruption can be temporary or persistent.

By means of the previously known techniques, in some instances it may be impossible or possible only in a restricted manner to identify the functionality restricted on account of a fracture by evaluation of operating parameters of the electronic system itself. If the electronic system continues to be used despite restricted functionality, deficiencies in respect of safety can occur.

SUMMARY

Therefore, there is a need for improved techniques for detecting a fracture of a substrate of a semiconductor chip. In particular, there is a need for such techniques for detecting the fracture which identify the fracture particularly reliably. Furthermore, there is a need for techniques which reduce the adverse influences of a fracture on the functionality of an integrated circuit of the semiconductor chip.

This object is achieved by the features of the independent patent claims. The dependent patent claims define embodiments.

In one example, a semiconductor chip comprises a substrate and an integrated circuit arranged on the substrate. The semiconductor chip also comprises an indentation of the substrate and a conductor track. The semiconductor chip also comprises a crossover between the indentation of the substrate and the conductor track. The semiconductor chip furthermore comprises an input interface. The input interface is configured to enable a test signal at a first end of the conductor track to be fed into the conductor track. The semiconductor chip furthermore comprises an output interface. The output interface is coupled to the conductor track at a second end of the conductor track. The second end of the conductor track is opposite the first end of the conductor track. The output interface is configured to enable detection of the test signal at the second end of the conductor track.

In a further example, a method comprises feeding a test signal into a conductor track of a semiconductor chip. The conductor track crosses an indentation of a substrate of the semiconductor chip. The method furthermore comprises detecting the test signal. The test signal is indicative of fracture of the substrate of the semiconductor chip at the indentation.

In a further example, a method comprises detecting a test signal. The test signal is indicative of fracture of a substrate of a semiconductor chip at an indentation of the substrate. The method furthermore comprises, depending on the detection: optionally providing an output signal from at least a first component and a second component of an integrated circuit. The integrated circuit is arranged on the substrate. The first component and the second component are configured to output redundant output signals.

The features set out above and features described below can be used not only in the corresponding combinations explicitly set out, but also in further combinations or in isolation, without departing from the scope of protection of the present invention.

BRIEF DESCRIPTION OF THE FIGURES

FIG. 3A is a schematic, perspective view of a semiconductor chip in accordance with various embodiments, wherein the semiconductor chip comprises two indentations arranged perpendicular to one another and running along the edges of components of the integrated circuit, wherein the components are configured to output redundant output signals.

FIG. 3B schematically illustrates a switch configured to provide optionally an output signal from at least one from the components in FIG. 3A depending on the detection of a test signal.

FIG. 4 schematically illustrates a semiconductor chip in accordance with various embodiments, wherein the semiconductor chip comprises an input interface, which is configured to feed a test signal at a first end of a conductor track into the conductor track, and an output interface having a contact pad for access by an external unit for detecting the test signal.

FIG. 5 schematically illustrates a semiconductor chip in accordance with various embodiments, wherein the semiconductor chip comprises an input interface and an output interface with a detector circuit, which is configured to detect the test signal.

FIG. 8 is a flow diagram of a method in accordance with various embodiments.

DETAILED DESCRIPTION OF EMBODIMENTS

Figure 1:
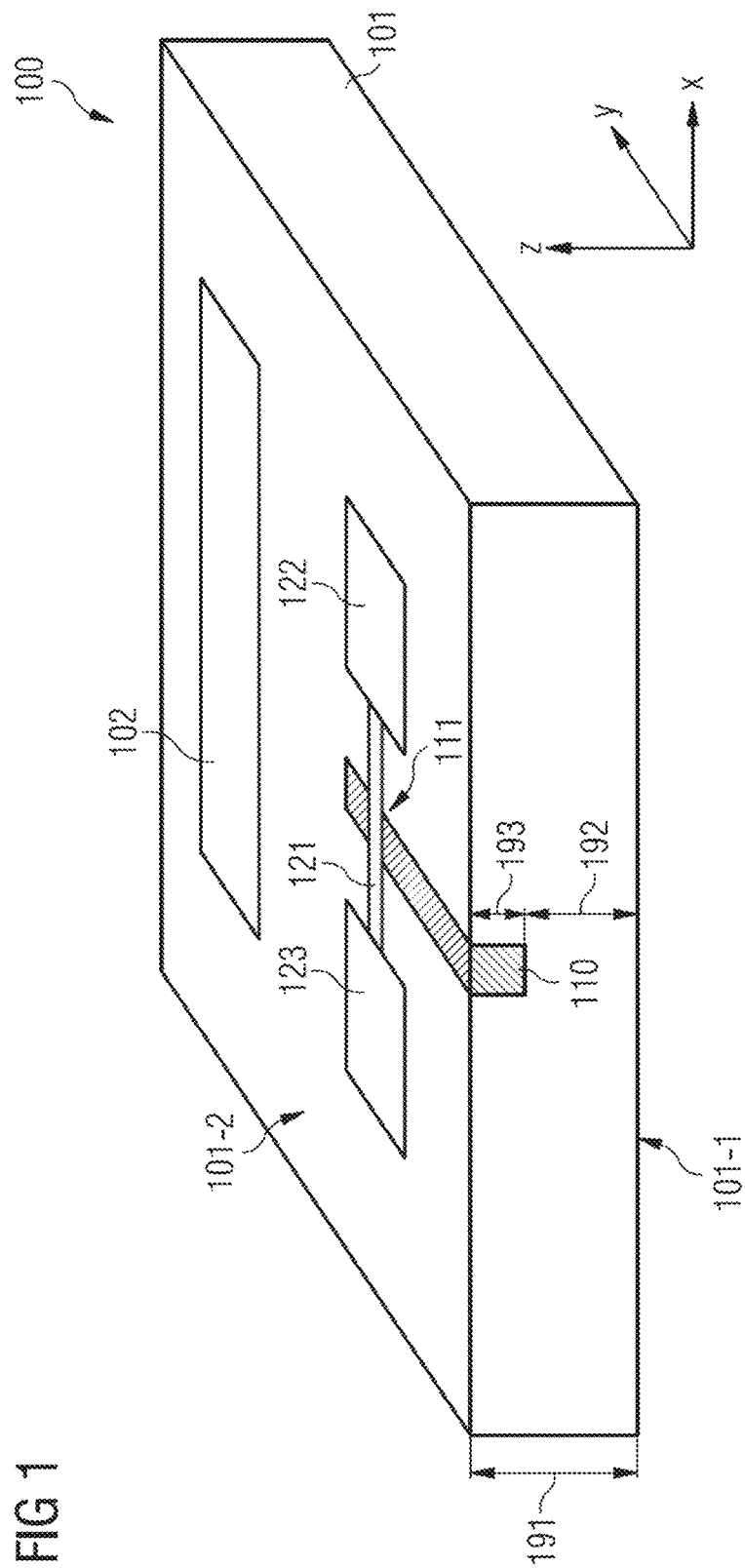
FIG. 1 is a schematic, perspective view of a semiconductor chip comprising a substrate, an integrated circuit, an indentation of the substrate, a conductor track and a crossover between the indentation and the conductor track in accordance with various embodiments.

The above-described properties, features and advantages of this invention and the way in which they are achieved will become clearer and more clearly understood in association with the following description of the exemplary embodiments which are explained in greater detail in association with the drawings.

The present invention is explained in greater detail below on the basis of preferred embodiments with reference to the drawings. In the figures, identical reference signs designate identical or similar elements. The figures are schematic representations of various embodiments of the invention. Elements illustrated in the figures are not necessarily illustrated in a manner true to scale. Rather, the various elements illustrated in the figures are reproduced in such a way that their function and general purpose become comprehensible to the person skilled in the art. Connections and couplings between functional units and elements that are illustrated in the figures can also be implemented as indirect connection or coupling. A connection or coupling can be implemented in a wired fashion or in a wireless fashion. Functional units can be implemented as hardware, software or a combination of hardware and software.

Various techniques in the context of the functionality of a semiconductor chip are described below. The semiconductor chip comprises an integrated circuit arranged on a substrate.

Techniques are described below which make it possible, for example, to foster the functionality of the semiconductor chip with integrated circuit even under great mechanical loading. In particular, in accordance with the techniques described herein, it may be possible, for example, to reduce the probability of a fracture of the substrate that restricts the functionality of the integrated circuit.

In further examples, in accordance with the techniques described herein, it may be possible to detect the occurrence of a fracture of the substrate reliably and rapidly. If a fracture is detected, corresponding safeguard measures can be initiated. The safeguard measures comprise, for example, outputting a warning to a user or switching off affected components of the semiconductor chip.

In various examples, it may be possible to identify specific components of the integrated circuit which are restricted in their functionality with a high probability on account of the fracture of the substrate. By way of example, it may be possible in various examples to spatially localize a position of the fracture on the substrate and to associate this position of the fracture with specific components of the integrated circuit whose functionality is possibly restricted on account of the fracture. If redundant components are present, it may then be possible to have recourse selectively to such components whose functionality is not restricted or not significantly restricted on account of the fracture.

Various examples of the present invention are based on the use of an indentation of the substrate. The indentation of the substrate can fulfill different functions. In a first exemplary functionality, the indentation of the substrate can direct a mechanical loading exerted on the semiconductor chip in a targeted manner into regions that are noncritical with regard to the functionality of the integrated circuit. The mechanical loading can bring about e.g. deformations or stresses and strains in the substrate. By way of example, the fracture may preferably occur at the location of the indentation of the substrate. In this regard, the indentation of the substrate in various examples can form a predetermined fracture location.

In a second exemplary functionality, by means of the indentation of the substrate it may be possible to detect a fracture of the substrate reliably and rapidly. In particular, by means of the indentation of the substrate it may be possible to detect a fracture of the substrate at the position of the indentation.

In order to detect the fracture of the substrate, a conductor track can be provided which extends between a first end and a second end. An input interface can be provided at the first end of the conductor track, said input interface being configured to enable a test signal at the first end to be fed into the conductor track. In various examples, it is possible for the input interface itself to be configured to feed the test signal at the first end into the conductor track; in further examples, it is also possible for the input interface to comprise for example a contact pad for access by an external unit, such that the external unit can be used to feed the test signal at the first end into the conductor track via the contact pad. An output interface can be provided at the second end of the conductor track, said output interface being configured to enable detection of the test signal at the second end of the conductor track. In various examples, it is possible for the output interface itself to be configured to detect the test signal at the second end of the conductor track by means of a detector circuit; in further examples, it is also possible for the output interface to comprise for example a contact pad for access by an external unit, such that the external unit can be used to detect the test signal at the second end of the conductor track.

A wide variety of types of test signals can be used. In one simple implementation, the test signal can correspond to a specific voltage, such that a DC current can flow. In such an implementation, the input interface can be embodied as a current source or voltage source. In further implementations, the test signal can also have an AC component. By way of example, the test signal could comprise square-wave pulses having a specific frequency and/or a predefined temporal sequence.

By way of example, it is possible for the test signal detected at the second end of the conductor track to be indicative of fracture of the substrate at the indentation. For this purpose, the semiconductor chip can comprise a crossover between the indentation and the conductor track. If the fracture of the substrate occurs at the indentation, for example, the conductivity of the conductor track can be impaired in the region of the crossover. This impairment of the conductivity of the conductor track can influence the detection of the test signal at the second end of the conductor track. By way of example, depending on the severity of the fracture, the conductivity of the conductor track in the region of the crossover can be decreased down to zero.

FIG. 1 illustrates aspects with regard to a semiconductor chip 100 in accordance with various embodiments, which comprises a substrate 101, an integrated circuit 102 arranged on the substrate 101, an indentation 110 of the substrate 101, and a conductor track 121. The semiconductor chip 100 also comprises a crossover 111 between the indentation 110 of the substrate 101 and the conductor track 121.

The integrated circuit 102 can be fabricated for example by means of an established multilayer technology, for example CMOS technology (complementary metal-oxide-semiconductor). Such a multilayer technology is based on the sequential exposure, development and processing of the substrate 101. The processing can comprise for example elements selected from the following group: doping; etching; and material deposition. A sequence of layers is obtained by means of the multilayer technology. The layers can be selected for example from the following group: metal layer; polycrystalline semiconductor layer; and doped semiconductor layer.

By way of example, the metal layer can be selected from the following group: noble metal layer; tungsten layer; aluminum layer; gold layer; layer comprising a metallic alloy; aluminum-copper layer.

The doped semiconductor layer can be e.g. an n+ layer or a p+ layer. The doped semiconductor layer can form e.g. source-drain connections of field effect transistors of components of the integrated circuit 102. It would also be possible for the doped semiconductor layer to form so-called isolator wells of components of the integrated circuit 102. These can e.g. surround the source contact or the drain contact of field effect transistors and produce an isolation relative to the substrate in this way. By way of example, the doped semiconductor layer can form an n-type well or a p-type well.

It is possible for the corresponding multilayer technology also to be used for producing the conductor track 121 and/or the indentation 110. By way of example, the conductor track 121 can comprise one or a plurality of layers. Said one or said plurality of layers of the conductor track 121 can correspond at least partly to one or a plurality of layers in the multilayer technology, as described above. If a plurality of layers are used for forming the conductor track 191, more reliable provision of the test signal at the output interface 122 can be achieved. If a smaller number of layers are used for forming the conductor track 191, it is possible to obtain a higher sensitivity in relation to fracture in the region of the indentation 110.

The substrate 101 can be for example monocrystalline silicon, polycrystalline silicon, a semiconductor substrate having a crystalline structure or a polycrystalline structure, a compound semiconductor substrate such as e.g. gallium arsenide having a crystalline structure or a polycrystalline structure etc.

If a fracture of the substrate 101 occurs in the region of the indentation 110, a reduced conductivity of the conductor track 121 in the region of the crossover 111 typically occurs. This reduced conductivity of the conductor track 121 in the region of the crossover 111 can be detected by means of an input interface 123 arranged at a first end of the conductor track 121 and by means of an output interface 122 arranged at a second end of the conductor track 121, said second end being opposite the first end. For this purpose, a test signal can be fed into the conductor track 121 via the input interface 123; a detection of the test signal 401 at the second end of the conductor track 121 can be made possible via the output interface 122. If the detection of the test signal 401 reveals for example a disappearance of the test signal 401 or a great suppression of the test signal 401 at the second end, this can be indicative of the presence of a fracture in the region of the indentation 110; therefore, the test signal 401 at the second end of the conductor track 121 can be indicative of a fracture of the substrate 101 in the region of the indentation 110.

By way of example, it may be possible to form a plurality of crossovers between an individual indentation 110 and a conductor track 121. By way of example, the conductor track 121 can run in a zig-zag pattern in relation to the indentation 110 and thus form a plurality of sequential crossovers. In this way, the sensitivity toward fracture can be increased.

It is evident from FIG. 1 that the substrate 101 in the region of the indentation 110 has a thickness 192 which is smaller than the thickness 191 of the substrate 101 in surrounding regions by a depth 193 of the indentation 110. By way of example, the indentation 110 can have a depth 193 that is greater than 50 nm, preferably >100 nm, particularly preferably >500 nm. It is also possible for the depth 193 to be >1 μm or >2 μm. By way of example, the depth 193 can be more than 5% of the thickness 191, preferably more than 15%, particularly preferably more than 30%.

The indentation 110 can be obtained for example by local removal of substrate material. A wide variety of techniques can be used for this purpose. By way of example, the indentation 110 can be obtained by means of etching processes. It would alternatively or additionally be possible to obtain the indentation 110 by means of grinding processes. In one simple implementation, the indentation 110 can be obtained by means of local scribing of the substrate 101; by way of example, a diamond tip can be used for this purpose. If the indentation 110 is obtained by means of etching processes, CMOS techniques, for example, can be used.

In principle, the indentation 110 can have a wide variety of forms. In particular, the indentation 110 can have different extents in the depth direction (i.e. in the Z-direction), as described above. It is also possible for the indentation 110 to have different cross-sectional forms in the XZ-plane (plane of the drawing in FIG. 1). By way of example, the indentation 110 can have a trapezoidal cross section in the XZ-plane, i.e. can have walls which do not run perpendicularly, but rather are at a shallower angle relative to the XY-plane. Etching processes are known which enable such a geometrical configuration in trapezoidal form with a defined slope of the walls. The indentation 110 can also have a wide variety of lateral forms in the XY-plane, i.e. parallel to a surface 101-2 of the substrate 101. By way of example, the indentation 110 can have an elongate form having a first end and a second end, wherein the second end is opposite the first end. The indentation 110 can run between the first end and the second end on a straight line or else follow a curved curve. FIG. 1 shows an example in which the indentation 110 has a straight elongate form and the first end of the indentation 110 is arranged at the edge 101-1 of the substrate 101. The edge 101-1 can be obtained for example by cutting or breaking a wafer. Such an arrangement of the indentation 110 can be advantageous since large mechanical loadings typically occur in particular in the region of the frame 101-1 of the substrate 101.

In various examples, the indentation 110 can have a specific orientation with respect to characteristic directions of the substrate 101. By way of example, it would be possible for the substrate 101 to have a crystal structure; in such a scenario it is possible for the indentations 110 to be arranged along specific crystal axes of the substrate 101, for example along the (1,0,0) direction, etc.

In one example, the indentation can form an exposed trench (not shown in FIG. 1). The exposed trench can form a topology which has the effect that the conductor track 121 in the region of the crossover 111 has an extent along the Z-direction—i.e. along the thickness 191 of the substrate 101 and perpendicular to the surface 101-2. By way of example, the exposed trench can have a trapezoidal cross section in the XZ-plane and/or the YZ-plane. It may be worthwhile here for the walls of the trench to have a significant extent in the X-direction and/or Y-direction (that is to say perpendicular to the Z-direction), that is to say for the trench to have no vertical walls. The formation of the crossover 111 can be fostered by such techniques. In particular, topology-dictated interruptions of the conductor track 121 can be avoided.

In further examples, it is also possible for the indentation 110 not to have an exposed trench, but rather to be filled with material. By way of example, the indentation 110—for instance up to the edge of the trench—can be filled with material, such that a surface 101-2 of the substrate 101 in the region of the indentation 110 has no or no significant variation in the Z-direction perpendicular to the surface 101-2 of the substrate 101. In such an example, forming the crossover 111 may be possible in a particularly simple manner.

A wide variety of materials can be used for filling the trench. By way of example, isolator material can be used. In one example, the indentation 110 can be filled with isolator material. In such an example, the indentation 110 can form an isolator trench. By way of example, the isolator material can be silicon dioxide or some other metal oxide.

In the example in FIG. 1, the semiconductor chip 100 comprises only one individual indentation 110. However, implementations in which the semiconductor chip 100 comprises a plurality of indentations 110 are also possible.

Figure 2A:
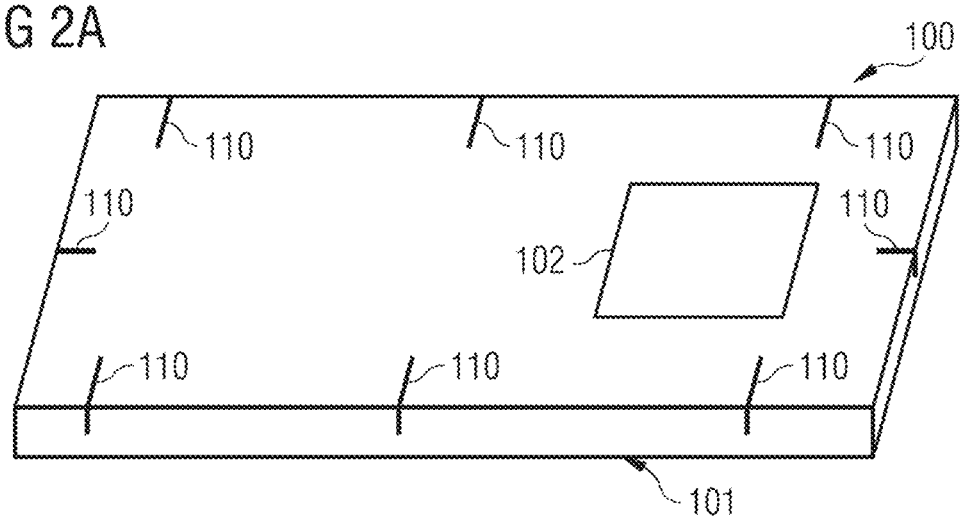
FIG. 2A is a schematic, perspective view of a semiconductor chip in accordance with various embodiments, wherein the semiconductor chip comprises a plurality of indentations.

FIG. 2A illustrates aspects with regard to a semiconductor chip 100 comprising a plurality of indentations 110 of the substrate 101. In the example in FIG. 2A, the semiconductor chip 100 comprises eight indentations 110 arranged along the circumference of the substrate 101 in each case perpendicular to the edge of the substrate 101. In such an arrangement, loadings of the substrate 101 can be guided particularly efficiently to a closest indentation 110.

In the example in FIG. 2A, the indentations 110 of the substrate 101 also run along different directions. In this way, it may be possible to guide directional loadings of the substrate 101, for example along specific crystal axes, particularly efficiently to a closest indentation 110.

While the different indentations 110 have an elongate form along directions oriented perpendicular to one another in the example in FIG. 2A, in other examples it would also be possible to provide a plurality of indentations 110 having an elongate form which are oriented along directions that form an angle of less than 90° with one another in the XY-plane. It is thus possible for the semiconductor chip 100 to comprise a plurality of indentations 110 having an elongate form which run along different directions.

Insofar as the semiconductor chip 100 comprises a plurality of indentations 110, a wide variety of implementations of the conductor track(s) can be realized. By way of example, one conductor track can be present or a plurality of conductor tracks can be present. By way of example, an individual crossover can be present per conductor track or more than one crossover with a plurality of indentations can be present per conductor track.

Figure 2B:
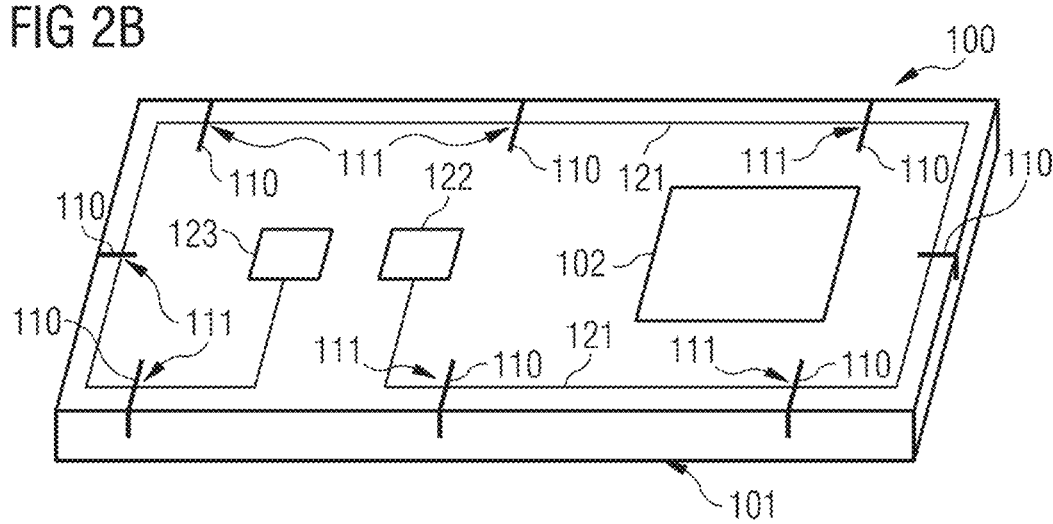
FIG. 2B is a schematic, perspective view of a semiconductor chip in accordance with various embodiments, wherein the semiconductor chip comprises a plurality of indentations and an individual conductor track with a plurality of crossovers between the conductor track and the plurality of indentations.

FIG. 2B illustrates aspects with regard to a conductor track 121 having a plurality of crossovers 111 with different indentations 110 of the substrate 101. FIG. 2B corresponds, in principle, to the example in FIG. 2A. FIG. 2B furthermore illustrates the input interface 123 and the output interface 122. In the example in FIG. 2B, an individual conductor track 121 connects the input interface 123 to the output interface 122. The conductor track 121 has successively arranged crossovers 111 with the different indentations 110. This means that the conductor track 121 is associated with more than one indentation 110. In such an example, a particularly simple detection of fracture can be implemented. Moreover, comparatively little structural space on the surface 101-2 is required for the conductor track 121.

In the example in FIG. 2B, the conductor track has an individual crossover 111 per indentation 110; in principle, it would also be possible for the conductor track 121 to have more than one crossover 111 per indentation 110, that is to say that the conductor track 121 crosses the one or the plurality of indentations 110 multiply in each case.

Figure 2C:
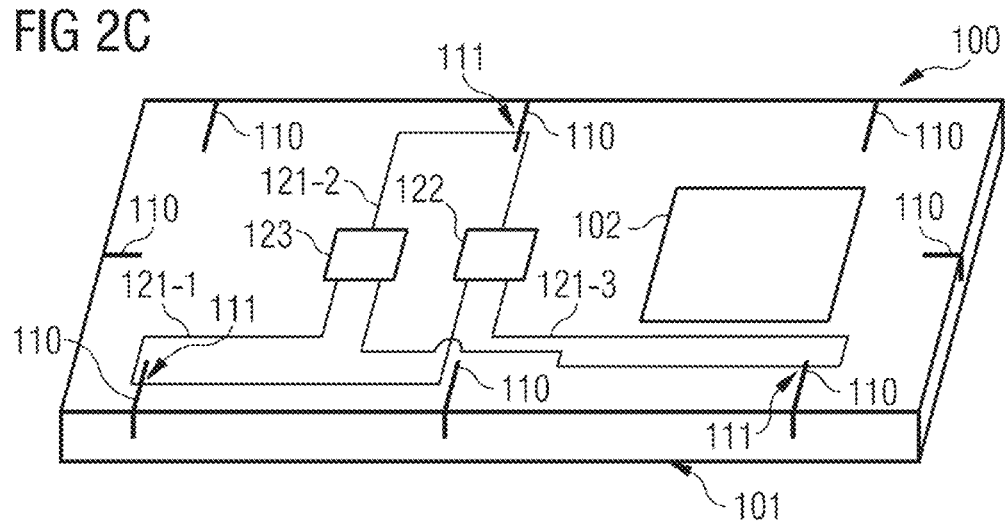
FIG. 2C is a schematic, perspective view of a semiconductor chip in accordance with various embodiments, wherein the semiconductor chip comprises a plurality of indentations and a plurality of conductor tracks, wherein each conductor track is associated in each case with an individual indentation via a corresponding crossover.

FIG. 2C illustrates aspects with regard to conductor tracks 121-1, 121-2, 121-3 having in each case an individual crossover 111 with an indentation 110. FIG. 2C thus illustrates a scenario in which the semiconductor chip 100 comprises a plurality of indentations 110 and a plurality of conductor tracks 121-1, 121-2, 121-3. Per indentation 110, the semiconductor chip 100 comprises at least one crossover 111 (however, only three conductor tracks 121-1, 121-2, 123-3 are illustrated in FIG. 2C, for reasons of clarity). FIG. 2C corresponds, in principle, to the example in FIG. 2A. FIG. 2C furthermore illustrates the input interface 123 and the output interface 122. In the example in FIG. 2C, a plurality of conductor tracks 121 connect the input interface 123 to the output interface 122; in particular, in each case one conductor track 121 is provided per indentation 110 in the example in FIG. 2C. This means that the semiconductor chip 100 comprises for each indentation 110 at least one crossover 111 with a corresponding conductor track 121-1, 121-2, 121-3, wherein no conductor track 121-1, 121-2, 121-3 is associated with more than one indentation 110. Such an arrangement makes it possible, given a suitable configuration of the input interface 123 and the output interface 122, to detect fracture of the substrate 101 in a manner resolved for the different indentations 110 (in a spatially resolved manner).

In the example in FIG. 2C, each of the conductor tracks 121-1, 121-2, 121-3 has an individual crossover 111 in each case per indentation 110; in principle, it would also be possible for individual or all of the conductor tracks 121-1, 121-2, 121-3 to have more than one crossover 111 with the corresponding indentation 110, that is to say that each of the conductor tracks 121-1, 121-2, 121-3 crosses the corresponding indentation 110 multiply in each case.

It is evident from the above examples in FIGS. 1, 2A-2C that the form, size, orientation, number and arrangement of the indentations 110 used can vary depending on the implementation. Typically, it may be worthwhile to define the form, size, orientation, number and arrangement of the indentations 110 used depending on the concrete form of the substrate 101 and/or depending on the concrete form of the integrated circuit 102. For this purpose, for example, it is possible to use numerical simulations or reference measurements which provide information about the type, propagation and strength of mechanical loadings and stresses and strains in the semiconductor chip 100.

It is evident from the above examples in FIGS. 1, 2A-2C that the form, size, orientation, number and arrangement of the indentation 110 can vary depending on the implementation. In this case, it may be worthwhile, in principle, to determine these and other parameters of the indentation 110 with regard to two criteria. Firstly: robustness with respect to fracture. Secondly: capability of absorbing loadings. Firstly, the intention is typically to ensure that the stability of the substrate 101 is not significantly reduced by the provision of the indentation 110. On the other hand, the intention is to ensure that a fracture that can no longer be prevented—e.g. on account of unexpectedly high loadings or wear—preferably occurs in the region of the indentation 110 and the integrated circuit 102 is thus protected. Fulfilling these two criteria typically constitutes a compromise situation (referred to as trade-off).

In the examples in FIGS. 1, 2A-2C the semiconductor chip 100 comprises in each case one individual input interface 123 and one individual output interface 122. In further examples, it would also be possible to provide more than one individual input interface 123 and/or more than one individual output interface 122. By way of example, it would be possible to provide per indentation 110 of the substrate 101 in each case an assigned input interface 123 and/or in each case an assigned output interface 122. By means of such techniques, it is possible to ensure a redundancy when detecting fracture of the substrate 101.

In the examples in FIGS. 1, 2A-2C, the input interface 123, the output interface 122 and the integrated circuit 102 are in each case arranged at a distance from the at least one indentation 110. In this way, it is possible that in the case of a fracture of the substrate 101 in the region of the indentation 110, the functionality of the input interface 123, of the output interface 122 and of the integrated circuit 102 is not or not significantly impaired. Furthermore, it is possible to arrange the indentations 110 flexibly. In other examples, however, it may also be worthwhile to arrange the indentation 110 for example particularly near to individual components of the integrated circuit.

FIG. 3A illustrates aspects with regard to arranging the indentation 110 along edges of components 301, 302 of the integrated circuit 102. In the example in FIG. 3A, two indentations 110 having an elongate, straight form are arranged perpendicular to one another in the region of the integrated circuit 102. In particular, the indentations 110 are arranged along the edges of a component 302. One of the indentations 110 is arranged between the component 302 and the component 301.

A wide variety of effects can be achieved by an arrangement of the indentations 110 in accordance with the example in FIG. 3A. A first effect concerns a protection functionality; by arranging the indentations 110 in the region surrounding the component 302, it is possible to shield the component 302 from mechanical loadings. Stresses and strains which propagate for example from edge regions of the substrate 101 in the direction of the component 302 can be absorbed by the indentations 110, directed away from the component 302 or influenced in some other way, such that the component 302 is protected. A second effect concerns the provision of fracture information for the operation of redundant components. By way of example, it would be possible for the component 301 and the component 302 to be configured to output redundant output signals. By way of example, in one example both the first component 301 and the second component 302 could implement sensor functionality with regard to a specific physical variable. It would be possible, for example, for the first component 301 to be a magnetic field sensor, and for the second component 302 to be a corresponding, redundant magnetic field sensor. Keeping identical components 301, 302 available in a redundant manner can make it possible to foster the functionality and fail-safety of the semiconductor chip 101.

FIG. 3B illustrates aspects with regard to a switch 350 configured to provide optionally the output signal from at least one from the first component 301 and the second component 302, depending on the detection of the test signal. In FIG. 3B, the switch 350 is embodied as a 3-way switch. By way of example, in normal operation, i.e. if no fracture of the substrate 101 is detected by the output interface 122, the switch can provide a combination of the output signals of the components 301, 302 (the central position in FIG. 3B). In a scenario in which a fracture of the substrate 101 is detected which impairs the functionality of the component 301 (the component 302), the switch 350 can provide the output signal of the component 302 (the component 301).

Whereas the selection of the output signal from the components 301, 302 is carried out by means of the switch 350 on the semiconductor chip 100 in the example in FIG. 3B (on-chip), an external logic can also have corresponding functionality in other examples (off-chip).

In the various examples described herein, it is possible to use a wide variety of techniques for detecting a fracture of the substrate 101. In particular, it is possible to use a wide variety of techniques for detecting the test signal at the second end of the conductor track 121. Such techniques may comprise, for example, measuring a source impedance, a current flow, a signal-to-noise ratio, a rate of change or a transient, etc. In principle, it is possible for the detection of the test signal to take place by means of logic arranged on the semiconductor chip 100 (on-chip). However, it would also be possible for the detection of the test signal to take place by means of external logic (off-chip). Combined on-chip/off-chip solutions are also conceivable.

FIG. 4 illustrates aspects with regard to the output interface 122. FIG. 4 illustrates, in particular, an off-chip arrangement of the logic for detecting the test signal. In the example in FIG. 4, the output interface 122 comprises a contact pad 422, which has dimensions measuring e.g. at least 2×2 µm, preferably at least 20×20 µm, particularly preferably at least 100×100 µm. The contact pad 422 serves for access by an external unit 450. By way of example, the external unit 450 can be a measuring instrument configured to detect the test signal 401 that is fed into the conductor track 121 by a signal generator of the input interface 123 (an operational amplifier in the example in FIG. 4). For this purpose, e.g. a contact tip can be brought into contact with the contact pad 422.

It would be possible, for example, for the contact pad 422 to be embodied as part of an application interface of a sensor of the integrated circuit 102. This can be for example a connection to an external macrocontroller or an ECU (electronic control unit). By way of example, the contact pad 422 can be part of a standardized connection. One example would be an SPI (serial peripheral interface) or PSIS (peripheral sensor interface) connection. In order to provide the test signal 401 having a desired potential, a corresponding resistor 421 can be provided: in the example in FIG. 4, a so-called pull-down resistor connected to ground. In other examples, a pull-up resistor can also be used.

FIG. 5 illustrates aspects with regard to the output interface 122. FIG. 5 illustrates an on-chip arrangement of the logic for detecting the test signal 401. In the example in FIG. 5, the output interface 122 comprises a detector circuit in the form of a voltage follower 521 with resistor 522. The detector circuit detects the test signal 401 at the second end of the conductor track 121.

In order also to detect temporary fractures, it may be possible for the detector circuit to be configured to detect corresponding transients of the test signal 401. For this purpose, the detector circuit can for example comprise a storage element and be configured to write to the storage element depending on the detection of the test signal 401. By way of example, a flip-flop or a latch can be used as storage element. As a result, even short deviations from a reference profile of the received test signal 401 can be taken into account.

Figure 6:
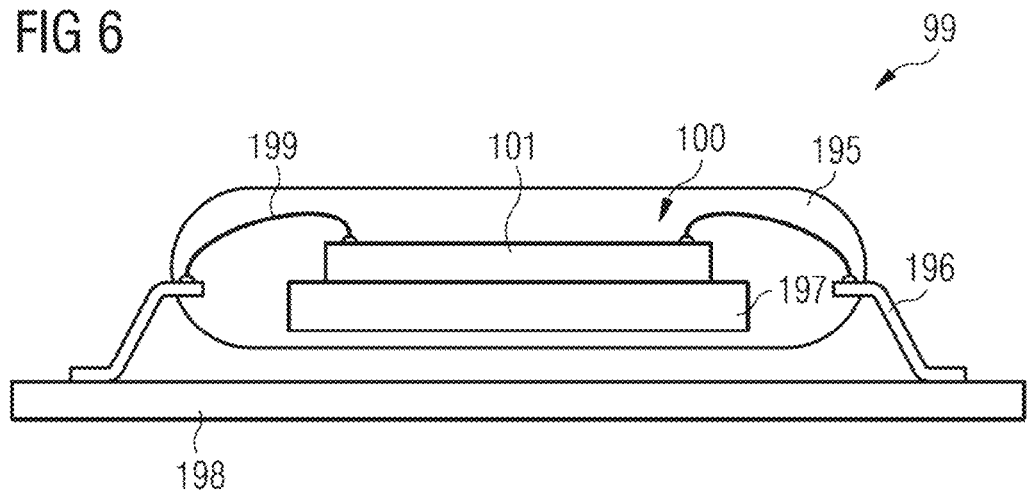
FIG. 6 schematically illustrates an electronic component in accordance with various embodiments, which comprises a semiconductor chip, a housing and a carrier.

FIG. 6 illustrates aspects with regard to an electronic component 99 comprising the semiconductor chip 100 with substrate 101. The substrate 101 is arranged on a leadframe 197, which ensures for example a thermal coupling to a carrier 198, for example a PCB board. The semiconductor chip 100 is situated in a housing 195 that can be generated by means of injection-molding technology, for example. A die paddle 196 produces a connection to bonding wires 199 and thus connects the integrated circuit 102 to the PCB board 198.

Figure 7:
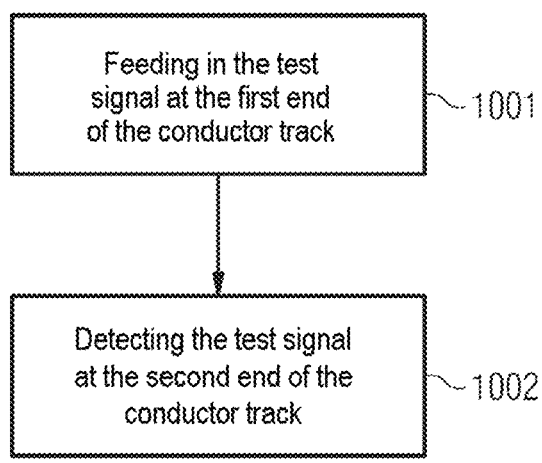
FIG. 7 is a flow diagram of a method in accordance with various embodiments.

FIG. 7 illustrates a method in accordance with various embodiments. Firstly, the method involves feeding in the test signal 401 at the first end of the conductor track 121 (step 1001). By way of example, the test signal 401 can be fed in at the first ends of a plurality of conductor tracks 121. The input interface 123 is used for feeding in the test signal. The input interface 123 can comprise passive components and/or active components. By way of example, feeding in the test signal can comprise producing a connection to an external unit, e.g. on a point probe station. The test signal 401 can comprise a DC component and/or an AC component. The test signal 401 can have a well-defined temporal sequence and/or well-defined spectral components.

This is then followed by detecting the test signal 401 at the second end of the conductor track 121, said second end being opposite the first end of the conductor track (step 1002). Detecting the test signal 401 can comprise on-chip and/or off-chip logic. The output interface 122 is used for detecting the test signal 401. The output interface 122 can comprise passive components and/or active components. By way of example, detecting the test signal 401 can comprise a connection to an external unit, for example via the contact pad 422, and on a point probe station. Detecting the test signal 401 can comprise measuring different physical variables. By way of example, a current flow, a potential, an impedance, a signal level, a spectral range, etc. can be measured.

FIG. 8 illustrates a method in accordance with various embodiments. Firstly, the method involves detecting the test signal 401 at the second end of the conductor track 121 (step 1011; step 1011 corresponds to step 1001).

Depending on the detection in accordance with step 1011, the method subsequently involves checking whether a fracture of the substrate 101 is present in the region of the corresponding indentation 110 (step 1012). By way of example, step 1012 can involve checking whether the detected test signal 401 at the second end corresponds to a reference value. The reference value can be derived, for example, from properties of the test signal 401 fed in at the first end, and furthermore properties of the conductor track 121 in an intact state of the substrate 101 without fracture. By way of example, a reference impedance of the conductor track 121 and/or the signal waveform of the test signal 401 fed in at the first end of the conductor track 121 can be taken into account in this case. If the detected test signal 401 in step 1011 deviates significantly from the reference value, the fracture of the substrate 101 can be detected in step 1012.

If no fracture is detected in step 1012, step 1013 subsequently involves providing the output signals of a first component 301 and of a second component 302, which are configured to output redundant output signals.

However, if step 1012 establishes that a fracture is present, steps 1014, 1015, 1017 subsequently involve checking whether the fracture is present at the first component 301 or at the second component 302 or at both components 301, 302. For this purpose, by way of example, it is possible to have recourse to a plurality of test signals 401 which at the second ends of different conductor tracks 121 which cross different indentations 110. The detection of the fracture can be carried out in a spatially resolved manner.

If the fracture is present only at the first component 301 and is not present at the second component 302, providing the output signal of the second component 302 is carried out (steps 1014, 1015, 1016). If the fracture is present only at the second component 302 and is not present at the first component 301, providing the output signal of the first component 301 is carried out (steps 1014, 1017, 1018). If the fracture is present both at the first component 301 and at the second component 302, a warning is output (steps 1014, 1015, 1019).

To summarize, techniques have been disclosed above which make it possible to enable an improved functionality of a semiconductor chip. The techniques described herein make it possible, on the one hand, to absorb loadings and stresses and strains of the substrate of the semiconductor chip by means of targeted provision of indentations in the substrate in noncritical regions and in this way to protect functionally critical components of an integrated circuit. The techniques described herein make it possible, on the other hand, to reliably detect fractures of the substrate; for this purpose, crossovers between the indentations and conductor tracks are provided, such that in the case of a fracture the electrical properties of the conductor tracks change in the region of the crossovers. Such a change in the electrical properties of the conductor tracks in the region of the crossovers can be detected by means of a test signal.

It goes without saying that the features of the above-described embodiments and aspects of the invention can be combined with one another. In particular, the features can be used not only in the combinations described, but also in other combinations, or by themselves, without departing from the field of the invention.

The invention claimed is:

1. A method, comprising:
feeding a test signal into a first end of a conductor track of a semiconductor chip, wherein the conductor track crosses an indentation of a substrate of the semiconductor chip; and
detecting the test signal at a second end of the conductor track, wherein the detected test signal has a changed characteristic indicative of fracture of the substrate of the semiconductor chip at the indentation.

2. The method of claim 1, further comprising:
feeding one or more test signals into first ends of a plurality of conductor tracks, wherein the plurality of conductor tracks cross one or more indentations of the substrate; and
detecting the one or more test signals from second ends of the plurality of conductor tracks.

3. The method of claim 1, further comprising:
receiving the test signal from external the semiconductor chip.

4. The method of claim 1, wherein the test signal has a defined temporal sequence or defined spectral components.

5. The method of claim 1, further comprising:
detecting the test signal using on-chip logic.

6. The method of claim 1, further comprising:
detecting the test signal using off-chip logic.

7. The method of claim 1, wherein the detecting of the test signal comprises measuring a current flow, a potential, an impedance, a signal level, or a spectral range.

8. A method, comprising:
feeding a test signal into a first end of a conductor track of a semiconductor chip, wherein the conductor track crosses an indentation of a substrate of the semiconductor chip;
detecting the test signal at a second end of the conductor track of the semiconductor chip, wherein the detected test signal is indicative of fracture of the substrate of the semiconductor chip at the indentation of the substrate; and
depending on the detection, providing an output signal from at least one of a first component and a second component of an integrated circuit arranged on the substrate,
wherein the first component and the second component are configured to output redundant output signals.

9. The method of claim 8, wherein the detecting comprises:
determining whether the detected test signal corresponds with a reference value.

10. The method of claim 9, wherein the reference value is derived from a property of the test signal fed in at another end of the conductor track when the substrate is without fracture.

11. The method of claim 9, wherein the property is an impedance of the conductor track.

12. The method of claim 9, wherein the property is a waveform of the test signal.

13. The method of claim 9, wherein if the detected test signal deviates by more than a predetermined amount from the reference value, the fracture of the substrate is detected.

14. The method of claim 8, further comprising:
providing the output signals of a first component and of the second component, if no fracture is detected.

15. The method of claim 8, further comprising:
if a fracture is detected, checking whether the fracture is present at the first component or at the second component or at both the first and second components.

16. The method of claim 15, further comprising:
providing the output signal of the second component, if the fracture is present at the first component and is not present at the second component.

17. The method of claim 16, further comprising:
providing the output signal of the first component, if the fracture is present at the second component and is not present at the first component.

18. The method of claim 17, further comprising:
outputting a warning by the integrated circuit, if the fracture is present both at the first component and at the second component.

19. The method of claim 8, wherein the detecting comprises:
detecting one or more test signals at respective ends of a plurality of conductor tracks of the semiconductor chip, wherein the detected one or more test signals are indicative of any fractures of the substrate at one or more indentations of the substrate.

20. The method of claim 19, wherein each of the plurality of conductor tracks crosses a different indentation of the substrate.

* * * * *